(12) United States Patent
Imamura et al.

(10) Patent No.: US 6,639,863 B2
(45) Date of Patent: Oct. 28, 2003

(54) SEMICONDUCTOR INTEGRATED CIRCUIT DEVICE HAVING LINK ELEMENT

(75) Inventors: Akira Imamura, Hyogo (JP); Yasuhiro Mabuchi, Hyogo (JP); Toshiaki Koyama, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/207,174

(22) Filed: Jul. 30, 2002

(65) Prior Publication Data

US 2003/0042523 A1 Mar. 6, 2003

(30) Foreign Application Priority Data

Sep. 3, 2001 (JP) ........................................ 2001-265733

(51) Int. Cl.[7] .............................................. G11C 29/00
(52) U.S. Cl. ................ 365/225.7; 365/201; 365/185.09
(58) Field of Search .............................. 365/225.7, 201, 365/189.07, 185.09

(56) References Cited

U.S. PATENT DOCUMENTS 6,178,125 B1 * 1/2001 Niiro ........................... 365/200
6,324,103 B2 * 11/2001 Hiraki et al. ............. 365/189.05
6,404,683 B1 * 6/2002 Yumoto ....................... 365/200
2002/0006062 A1 * 1/2002 Otori et al. ............. 365/189.07

FOREIGN PATENT DOCUMENTS

| JP | 4-170821 | 6/1992 |
| JP | 4-285798 | 10/1992 |

* cited by examiner

Primary Examiner—Michael S. Lebentritt
Assistant Examiner—Toan Le
(74) Attorney, Agent, or Firm—McDermott, Will & Emery

(57) ABSTRACT

A semiconductor integrated circuit device has a first LT fuse group for storing replacement information used in a memory array; a second LT fuse group for storing confirmation information to confirm whether the first LT fuse group has accurately stored the replacement information; and an input/output port for outputting information PI actually stored in the first LT fuse group and information CI actually stored in the second LT fuse group to an external memory tester. The first and second LT fuse groups are fabricated according to the same conditions, and the laser input to the respective group is set to be under the same conditions.

12 Claims, 3 Drawing Sheets

SEMICONDUCTOR INTEGRATED CIRCUIT DEVICE HAVING LINK ELEMENT

BACKGROUND OF THE INVENTION

1. Field of the Invention

The present invention relates to a semiconductor memory device, and more particularly to a semiconductor integrated circuit device with a link element, of which a fuse element is representative.

2. Description of the Background Art

Generally, a fuse element for storing a variety of information required for a prescribed operation is provided within a semiconductor integrated circuit device. For example, such information is obtained according to properties evaluated in an operation test which is conducted after chip manufacturing. Thus obtained information is stored on a chip in a non-volatile manner by blowing fuse elements.

As an example, a configuration will be described, in which, in a semiconductor integrated circuit device having a large scale semiconductor memory, replacement information required for replacing and repairing a defective memory cell to improve production yield is stored by means of fuse elements.

FIG. 5 is a schematic block diagram showing a configuration in which information is stored by fuse elements in a conventional semiconductor integrated circuit device.

Referring to FIG. 5, a conventional semiconductor integrated circuit device 100 has a memory array 101 and a laser trimming fuse (hereinafter, simply referred to also as LT fuse) group 102 blowable by a laser input. LT fuse group 102, in response to an external laser input, stores replacement information for replacing and repairing a defective memory cell in memory array 101 in a non-volatile manner.

In semiconductor integrated circuit device 100, in order to properly replace and repair defective memory cell to obtain desired effect, LT fuse group 102 has to correctly store the replacement information. In other words, LT fuse group 102 should be properly blown by an external laser input.

It is difficult, however, to directly determine whether LT fuses have been properly blown. That is to say, though it is possible by visual inspection to confirm whether these LT fuses have been optically blown, it is difficult to confirm whether they have been electrically blown.

Therefore, whether LT fuses have been properly blown to correctly store replacement information can be determined only indirectly through an operation test after the fuse blowing process. In other words, successful blowing of LT fuse could be confirmed only by evaluating whether replacement and repairment of a defective memory cell has been properly performed according to replacement information stored by LT fuses, that is, by evaluating operation of the entire semiconductor integrated circuit device.

Consequently, unless an operation test following the fuse blowing process is strictly conducted, a semiconductor integrated circuit device, in which LT fuses have not been properly blown, may be mistakenly determined as non-defective. In other words, it is difficult to simplify an operation test in a subsequent process because whether electrical blowing of LT fuses has been successful or not cannot be directly inspected.

SUMMARY OF THE INVENTION

An object of the present invention is to provide a configuration of a semiconductor integrated circuit device in which direct testing for whether a link element (of which an LT fuse is representative) has been properly blown can be conducted.

A semiconductor integrated circuit device according to the present invention includes an internal circuit for performing a prescribed operation; a plurality of first link elements for storing in a non-volatile manner first information used in the internal circuit in response to an external program input; a confirmation information storing portion to store in a non-volatile manner second information for confirming whether the plurality of first link elements have accurately stored the first information; and an input/output port for externally outputting information stored by the plurality of first link elements and information stored by the confirmation information storing portion in an operation test.

Such a semiconductor integrated circuit device can directly check whether the first link elements have stored prescribed information in a non-volatile manner in response to a given program input. Therefore, the operation test in a subsequent process can be simplified.

A semiconductor integrated circuit device according to another configuration of the present invention includes an internal circuit for performing a prescribed operation; a plurality of first link elements for storing in a non-volatile manner first information used in the internal circuit in response to an external program input; a confirmation information storing portion to store in a non-volatile manner second information for confirming whether the plurality of first link elements have accurately stored the first information; and an arithmetic circuit for externally outputting a determination result based on information stored by the plurality of first link elements and information stored by the confirmation information storing portion in an operation test.

Such a semiconductor integrated circuit device can directly determine whether the first link elements have stored prescribed information in a non-volatile manner in response to a given program input. Therefore, the operation test in a subsequent process can be simplified. In addition, determination result can be output using smaller number of terminals than that of the first and second link elements, desirably only one output terminal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
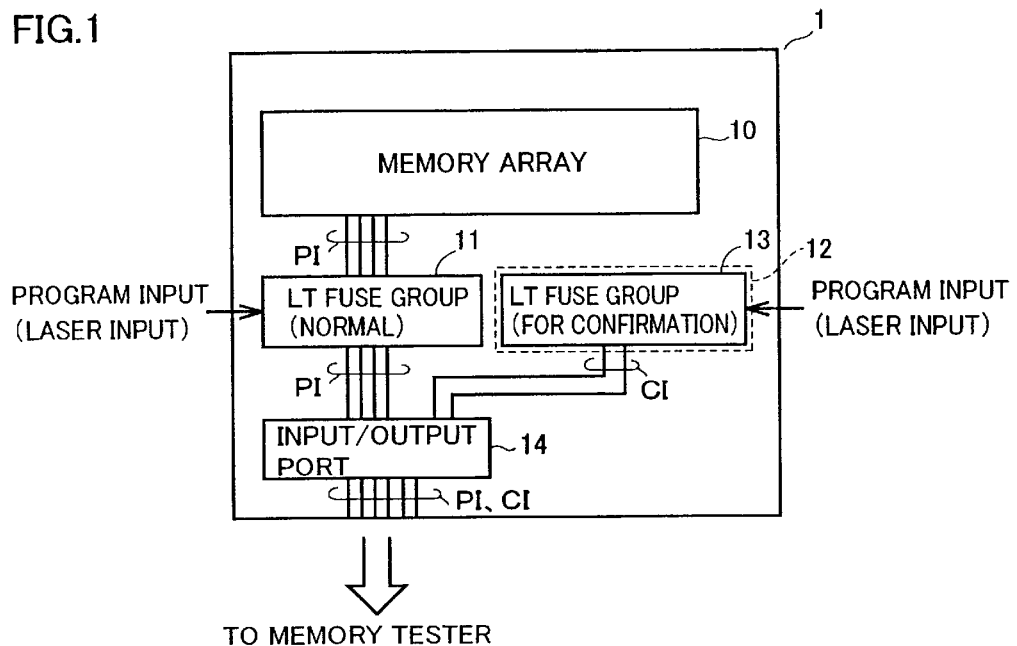
FIG. 1 is a schematic block diagram showing a configuration of a semiconductor integrated circuit device according to a first embodiment of the present invention.

In the following, embodiments of the present invention will be described in detail with reference to the figures. It is noted that the same reference characters refer to the same or corresponding components in the figures.

(First Embodiment)

Referring to FIG. 1, a semiconductor integrated circuit device 1 includes a memory array 10, an LT fuse group 11, an LT fuse group 13 provided as a confirmation information storing portion 12, and an input/output port 14.

Memory array 10 holds stored data which was written through a data writing operation, and outputs the same in a data reading operation.

LT fuse group 11, in response to an external program input (laser input), stores replacement information for performing a prescribed replacing and repairing operation in memory array 10. When blown in response to the external laser input, LT fuses make a transition from a conducting state which represents data "1" to a non-conducting state which represents data "0". Information of a plurality of bits can be stored as replacement information by a combination of conditions of respective LT fuses within LT fuse group 11.

Figure 2:
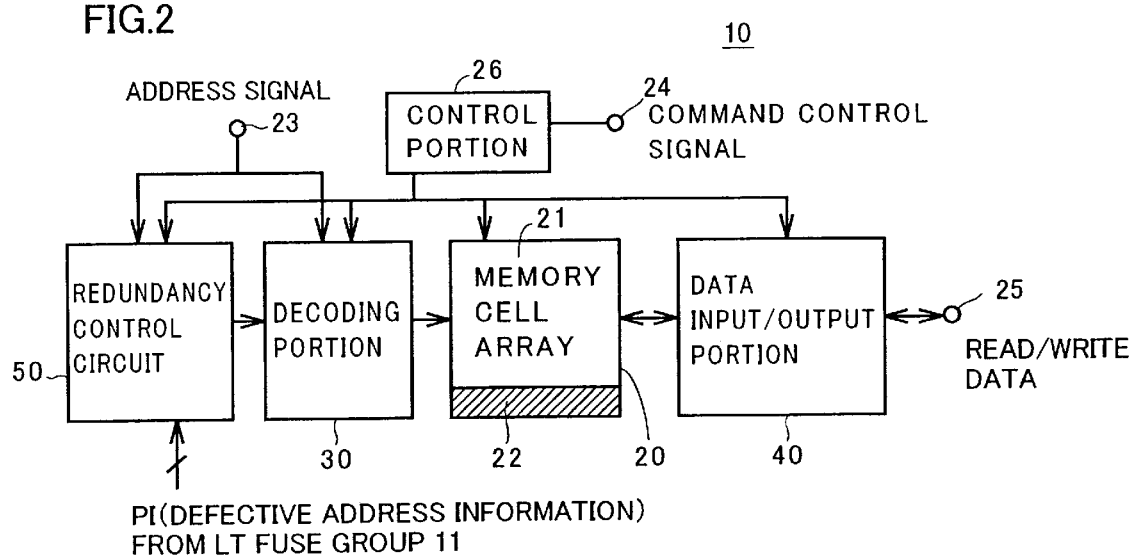
FIG. 2 is a block diagram showing a configuration of a memory array illustrated in FIG. 1.

Referring to FIG. 2, memory array 10 includes a memory cell array 20 divided into a normal memory cell area 21 containing a plurality of normal memory cells arranged in a matrix of rows and columns and a spare memory cell area 22 containing a plurality of spare memory cells. The plurality of spare memory cells are provided to replace and repair a defective memory cell in normal memory cell area 21.

Memory array 10 further includes an address terminal 23, a command control signal terminal 24, a data terminal 25 and a control portion 26.

Address terminal 23 receives an input of an address signal for designating an object to be accessed. Address signal specifies a row and a column of memory cells in normal memory cell area 21. Command control signal terminal 24 receives an input of a command control signal for instructing an operation of memory array 10. Data terminal 25 communicates read/write data, which is input from/output to memory cell array 20, with the outside of the memory array. Control portion 26 controls the entire operation of memory array 10 in order to perform instructed operation in response to a command control signal which has been input to command control signal terminal 24.

Memory array 10 further includes a decoding portion 30, a data input/output portion 40 and a redundancy control circuit 50.

Decoding portion 30 performs row selection and column selection related to normal memory cells in response to an address signal input to the address terminal. Data input/output portion 40 outputs to data terminal 25 the read data read from memory cell array 20 in a data reading operation, and writes in memory cell array 20 the write data input to data terminal 25 in a data writing operation.

Redundancy control circuit 50 receives information PI stored by a program input (laser input) in LT fuse group 11, as replacement information. Replacement information includes defective address information showing an address corresponding to a defective memory cell present in normal memory cell area 21 and information required for replacing and repairing operation of such a defective memory cell.

Redundancy control circuit 50 compares defective address information with the address signal input to address terminal 23. When a defective memory cell is to be accessed, based on the result of the comparison of both of the above, redundancy control circuit 50 gives an instruction to decoding portion 30 to access to a spare memory cell in spare memory cell area 22.

With this configuration, in memory array 10, a defective memory cell can be replaced and repaired based on replacement information stored in LT fuse group 11.

Referring again to FIG. 1, each LT fuse in LT fuse group 13 is fabricated according to the same conditions as each LT fuse in LT fuse group 11, and stores confirmation information for confirming whether LT fuse group 11 has accurately stored replacement information. In order to store confirmation information, the condition of a program input (laser input) for blowing LT fuse group 13 is set to be identical with that of the program input (laser input) for LT fuse group 11.

In embodiments of the present invention, an LT fuse blown by a laser input is shown as a representative of link elements which store information in a non-volatile manner by electrically connecting or disconnecting two nodes in response to an external program input. In other words, application of the present invention is not limited to LT fuses, and the present invention is applicable to link elements in a broad sense, which include an electrical fuse blown by a high voltage applied as a program input as well as an antifuse making a transition from a non-conducting state to a conducting state by a high voltage applied as a program input.

Confirmation information is defined to be identical with replacement information which should be stored in LT fuse group 11, or to be parity bit information corresponding to data of a plurality of bits representing replacement information. Particularly if parity bit information is used, the number of fuses required in LT fuse group 13 can be made smaller than in LT fuse group 11. Therefore, LT fuse group 13 constituting confirmation information storing portion 12 can be made compact.

Next, a specific example of parity bit information will be described. For $2^n$ (n: natural number) fuse elements (hereinafter, also referred to as normal fuse) included in LT fuse group 11, n parity fuses are provided in LT fuse group 13. An example will be considered, in which 3 bit parity fuses are provided for 8 bit normal fuses, and 4 of the 8 normal fuses are blown to store replacement information of "00110110" in a non-volatile manner. In this case, 3 bit data "100" is stored in parity fuses, to show the number of elements receiving the program input (laser input), of normal fuses, that is, the number of blown normal fuses (4 fuses).

When blowing of normal or parity fuses fails and fuses to be blown were not successfully blown, the number of blown fuses will be smaller on the side of the normal fuse. On the other hand, on the parity fuse side, since a bit to be "0" remains "1", the number of blown normal fuses shown by parity fuses will be larger. Therefore, two numbers match only when blowing is fully successful. Thus, presence of normal fuses which have not been properly blown electrically can be detected with parity fuses (LT fuse group 13) smaller in number than normal fuses (LT fuse group 11).

The parity bit information is not limited to the above-described example. Any error correcting code, various configurations of which are being proposed, is applicable.

Input/output port 14 output information PI actually stored in LT fuse group 11 and information CI actually stored in LT fuse group 13 to a memory tester disposed externally. If necessary, input/output port 14 may be configured so as to have a register function for temporarily storing the information.

In the memory tester, by performing comparison or operation of information PI and CI output from input/output port 14, it is possible to check whether LT fuse group 11 has stored prescribed information in a nonvolatile manner. This configuration allows checking of whether LT fuse group 11 has been properly blown electrically and whether prescribed replacement information has been accurately stored. Therefore, test items in an operation test in a subsequent process of fuse blowing can be omitted, to simplify the operation test.

(Second Embodiment)

Figure 3:
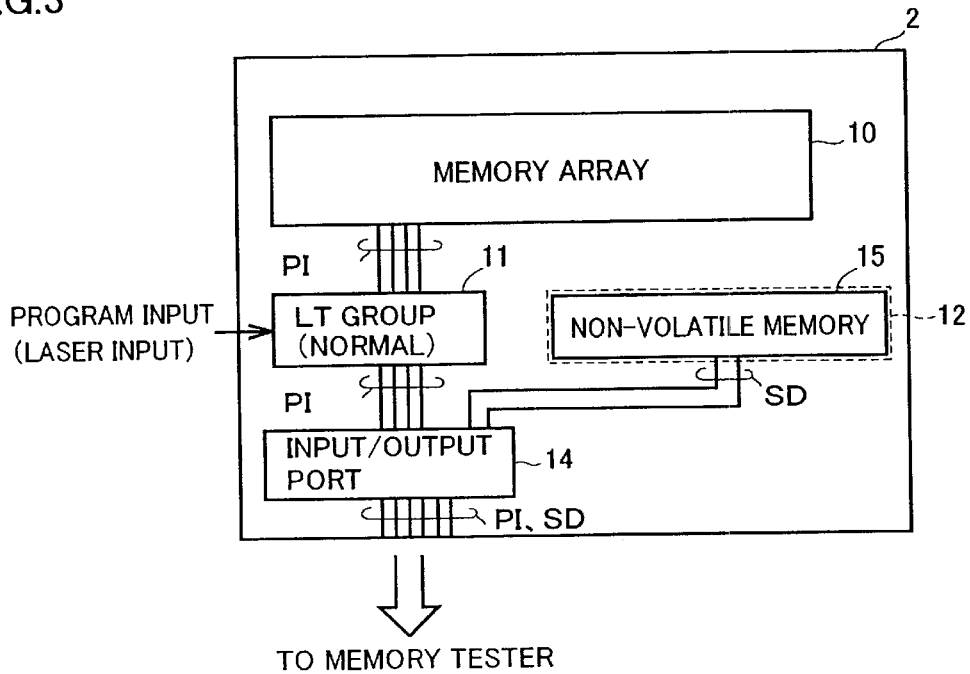
FIG. 3 is a schematic block diagram showing a configuration of a semiconductor integrated circuit device according to a second embodiment of the present invention.

Referring to FIG. 3, semiconductor integrated circuit device 2 according to the second embodiment of the present invention is different from the one according to the first embodiment shown in FIG. 1 in that the semiconductor integrated circuit device has a programmable non-volatile memory 15 instead of LT fuse group 13 as confirmation information storing portion 12. Since the configuration of other portions is the same as in semiconductor integrated circuit device 1 of the first embodiment, detailed description thereof will not be repeated.

Non-volatile memory 15 stores the same confirmation information as LT fuse group 13 in a non-volatile manner. Particularly in a semiconductor integrated circuit device originally having a non-volatile memory, non-volatile memory 15 can be configured by using free space in the existing non-volatile memory without adding a dedicated non-volatile memory.

Replacement information to be stored in LT fuse group 11 is obtained by an operation test conducted before fuse blowing process, and confirmation information based on such replacement information is stored in non-volatile memory 15. With such configuration as well, by performing comparison or operation of information PI stored in LT fuse group 11 and information CI stored in non-volatile memory 15 after the fuse blowing process, it is possible to check directly whether LT fuses have been properly blown electrically in LT fuse group 11, as in the first embodiment. Consequently, contents of the operation test after laser blowing process can be simplified.

(Third Embodiment)

Figure 4:
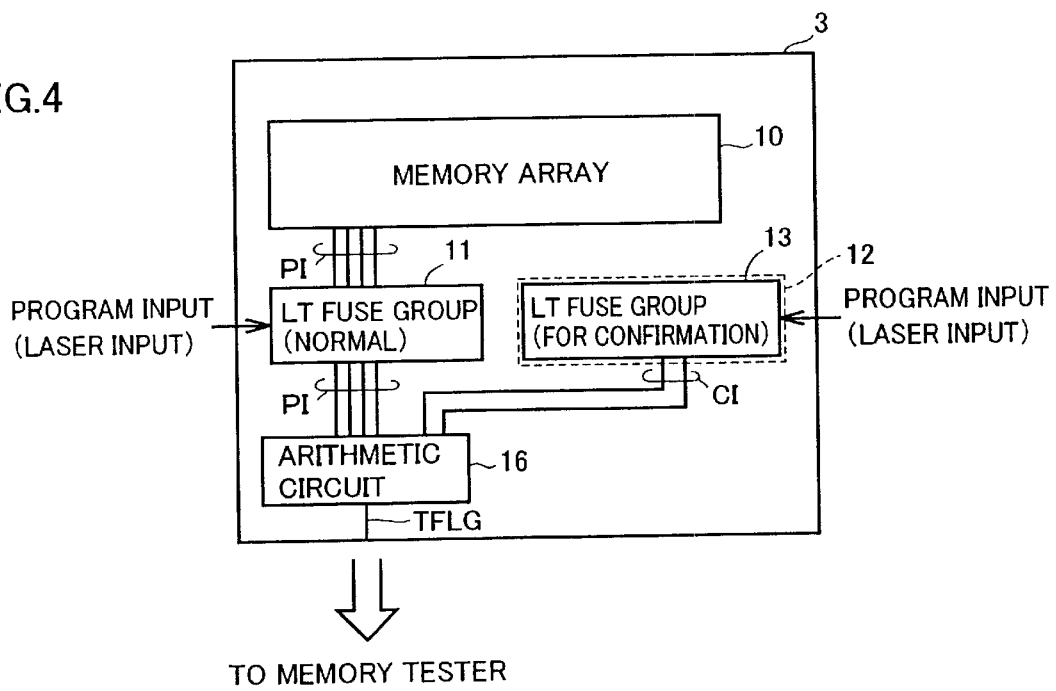
FIG. 4 is a schematic block diagram showing a configuration of a semiconductor integrated circuit device according to a third embodiment of the present invention.
Figure 5:
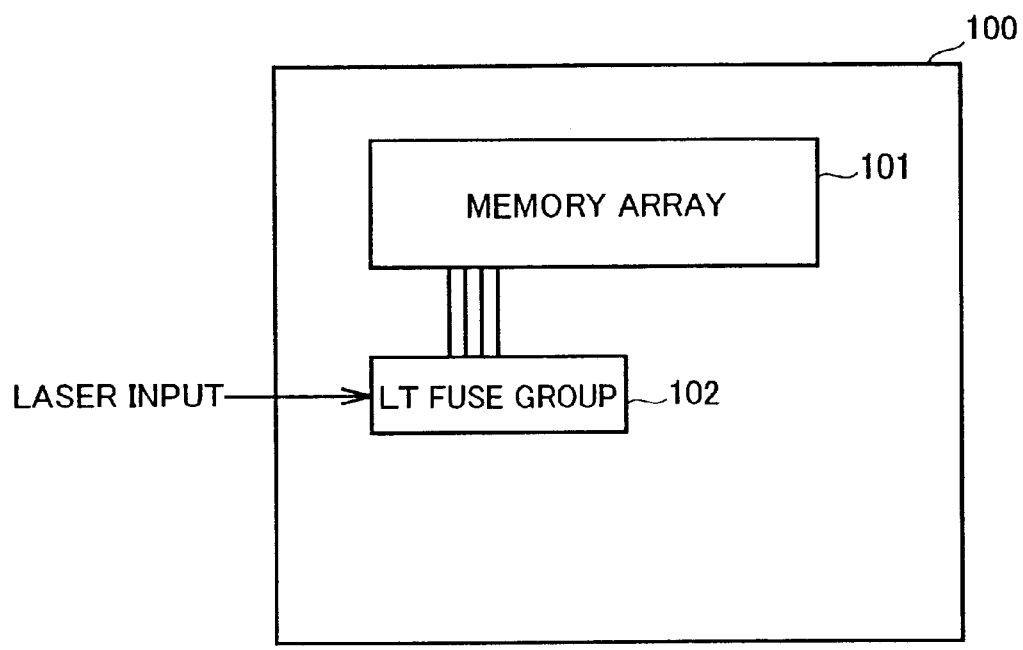
FIG. 5 is a schematic block diagram showing a configuration to store information with fuse elements in a conventional semiconductor integrated circuit device.

Referring to FIG. 4, semiconductor integrated circuit device 3 according to the third embodiment of the present invention is different from the one according to the first embodiment shown in FIG. 1 in that the semiconductor integrated circuit device has an arithmetic circuit 16 instead of input/output port 14. Arithmetic circuit 16 receives information PI stored in LT fuse group 11 and information CI stored in LT fuse group 13, and, according to an operation result from both of the above, outputs determination flag signal TFLG representing whether LT fuse group 11 has been properly blown electrically.

With such a configuration, determination result of whether LT fuse group 11 has been properly blown can be output by using smaller number of terminals than the total number of bits of information PI and CI, desirably only one output terminal.

Particularly in a single chip microcomputer and the like originally having an arithmetic circuit in a semiconductor integrated circuit device, arithmetic circuit 16 can be configured by utilizing an existing arithmetic circuit, without adding a dedicated arithmetic circuit. Thus, in such a semiconductor integrated circuit device, whether LT fuse group 11 has been properly blown can be effectively determined.

In a configuration in FIG. 4 according to the third embodiment, it is also possible to use non-volatile memory 15 instead of LT fuse group 13, as in the second embodiment.

In the present embodiments, configuration examples have been shown, in which replacement information for performing replacing and repairing operation of memory array is stored by link elements (of which representative is an LT fuse). The application of the present invention, however, is not limited to such examples; similar configurations are also applicable to link elements used for setting up, in a nonvolatile manner, operational conditions for operating modes and voltage level and the like, as well as voltage trimming and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
   an internal circuit performing a prescribed operation;
   a plurality of first link elements storing in a non-volatile manner first information used in said internal circuit in response to an external program input;
   a confirmation information storing portion storing in a non-volatile manner second information for confirming whether said plurality of first link elements have accurately stored said first information;
   an input/output port externally outputting information stored by said plurality of first link elements and information stored by said confirmation information storing portion in an operation test; and wherein
   said confirmation information storing portion includes a plurality of second link elements, each of which is manufactured under same conditions as each of said first link elements; and
   each of said second link elements receives a program input of the same conditions as each of said first link elements and stores said second information.

2. The semiconductor integrated circuit device according to claim 1, wherein
   each of said first and second link elements is a fuse element blowable in response to an external laser input.

3. The semiconductor integrated circuit device according to claim 1, wherein
   said second information is set to be identical with said first information.

4. The semiconductor integrated circuit device according to claim 1, wherein
   said first information has a plurality of bits; and
   said second information corresponds to parity bit information of said first information.

5. The semiconductor integrated circuit device according to claim 4, wherein
   said parity bit information represents number of first link elements receiving said program input so as to store said first information, of said plurality of first link elements.

6. The semiconductor integrated circuit device according to claim 1, wherein
   each of said first link elements is a fuse element blowable in response to an external laser input.

7. A semiconductor integrated circuit device, comprising:
   an internal circuit performing a prescribed operation;
   a plurality of first link elements storing in a non-volatile manner first information used in said internal circuit in response to an external program input;

a confirmation information storing portion storing in a non-volatile manner second information for confirming whether said plurality of first link elements have accurately stored said first information; and an arithmetic circuit externally outputting a determination result based on information stored by said plurality of first link elements and information stored by said confirmation information storing portion in an operation test; and wherein said confirmation information storing portion includes a plurality of second link elements, each of which is manufactured under same conditions as each of said first link elements; and each of said second link elements receives a program input of the same conditions as each of said first link elements and stores said second information.

8. The semiconductor integrated circuit device according to claim 7, wherein each of said first and second link elements is a fuse element blowable in response to an external laser input.

9. The semiconductor integrated circuit device according to claim 7, wherein said second information is set to be identical with said first information.

10. The semiconductor integrated circuit device according to claim 7, wherein said first information has a plurality of bits; and said second information corresponds to parity bit information of said first information.

11. The semiconductor integrated circuit device according to claim 10, wherein said parity bit information represents number of first link elements receiving said program input so as to store said first information, of said plurality of first link elements.

12. The semiconductor integrated circuit device according to claim 7, wherein each of said first link elements is a fuse element blowable in response to an external laser input.

* * * * *